United States Patent
Simpson

(10) Patent No.: US 7,325,220 B1
(45) Date of Patent: Jan. 29, 2008

(54) TECHNIQUES FOR AUTOMATICALLY RECOMMENDING A SUITABLE PROGRAMMABLE IC FOR A CIRCUIT DESIGN

(75) Inventor: Philip Andrew Simpson, San Jose, CA (US)

(73) Assignee: Altera Corporation, San Jose, CA (US)

( * ) Notice: Subject to any disclaimer, the term of this patent is extended or adjusted under 35 U.S.C. 154(b) by 345 days.

(21) Appl. No.: 10/876,035

(22) Filed: Jun. 23, 2004

(51) Int. Cl.
*G06F 17/50* (2006.01)

(52) U.S. Cl. .......................................... 716/16; 716/18

(58) Field of Classification Search ................ 716/1, 716/16–18
See application file for complete search history.

(56) References Cited

U.S. PATENT DOCUMENTS

| | | | |
|---|---|---|---|
| 6,598,207 B1 * | 7/2003 | Teague, III ..................... | 716/4 |
| 6,871,331 B1 * | 3/2005 | Bloom et al. .................. | 716/4 |
| 7,080,345 B1 * | 7/2006 | Iotov ........................... | 716/17 |
| 2002/0078423 A1 * | 6/2002 | Alden et al. ................... | 716/4 |
| 2002/0188910 A1 * | 12/2002 | Zizzo ........................... | 716/1 |
| 2005/0086039 A1 * | 4/2005 | Hamlin ........................ | 703/22 |
| 2006/0059447 A1 * | 3/2006 | Ariyama et al. .............. | 716/10 |

OTHER PUBLICATIONS

"System design Using SOPC Builder," product handbook version qii51003-1.0 from Altera Corporation San Jose, CA (Feb. 2004).
"MAX+PLUS ll Advanced Synthesis," product user guide version 1.0 from Altera Corporation San Jose, CA (Apr. 2003).
"MAX+PLUS ll Programmable Logic Development System and Software," product data sheet version 8 from Altera Corporation San Jose, CA (Jan. 1998).

* cited by examiner

*Primary Examiner*—Paul Dinh
(74) *Attorney, Agent, or Firm*—Townsend and Townsend and Crew, LLP

(57) ABSTRACT

Techniques are provided for automatically recommending a suitable programmable IC for a circuit design in response to receiving information about the circuit design. The information can be provided in any desired format. For example, specifications defining the circuit design can be provided in a spreadsheet. As another example, a user can select circuit components for the circuit design from a design library. The information describing the circuit design is compared with information about the features of available programmable ICs. A determination is then made as to which of the available programmable ICs is suitable for the circuit design.

17 Claims, 6 Drawing Sheets

|  | I/O Standard | I/O Standard | I/O Standard |  | LVDS | LVDS Performance |
|---|---|---|---|---|---|---|
| Number of Inputs |  |  |  | Number of Inputs |  |  |
| Number of Outputs |  |  |  | Number of Outputs |  |  |
| Number of Bidirs |  |  |  | Number of Bidirs |  |  |

Package

| Timing Requirements | Clock 1 |
|---|---|
|  | Clock 2 |
|  | Clock3 |
|  | Clock4 |
|  | Clock5 |
|  | Clock6 |
|  | Clock7 |
|  | Clock8 |
|  | Clock9 |
|  | Clock10 |
|  | Clock11 |
|  | Clock12 |
|  | tsu |
|  | tco |
|  | tpd |

Number of PLLs

| PLL Requirements | Number of Outputs | Performance |
|---|---|---|
| PLL1 |  |  |
| PLL2 |  |  |
| PLL3 |  |  |
| PLL4 |  |  |

| Number of Transceivers |  |  |
|---|---|---|
| Transceiver Requirements | Performance | Protocol |
| Transceiver1 |  |  |
| Transceiver2 |  |  |

Memory Interface Requirements

Logic Requirements
Internal Memory
DSP Functions

FIG. 2

TECHNIQUES FOR AUTOMATICALLY RECOMMENDING A SUITABLE PROGRAMMABLE IC FOR A CIRCUIT DESIGN

BACKGROUND OF THE INVENTION

The present invention relates to techniques for automatically recommending a programmable integrated circuit (IC). More particularly, the present invention relates to techniques for automatically recommending a programmable IC that is suitable for a circuit design.

A programmable logic integrated circuit (IC) is a general purpose IC that can be configured to implement a variety of circuit designs. Programmable logic ICs typically include repeating arrays of programmable logic blocks and memory blocks. Examples of programmable logic ICs include field programmable gate arrays (FPGA), programmable logic devices (PLDs), programmable logic arrays (PLAs), configurable logic arrays, etc.

PLD and FPGA manufacturers typically provide electronic design automation (EDA) tools that allow a user to build a circuit design in software using a hardware description language (HDL). An EDA tool synthesizes a circuit design into programmable logic blocks, places the logic blocks onto a particular IC, and configures the programmable routing connections between the logic blocks.

These processes are referred to as synthesis, place, and route. The synthesis, place, and route processes are usually targeted to a particular programmable logic device or family. Each device or family has a unique architecture that significantly effects the synthesis, place, and route processes. The user manually selects a particular programmable logic device or family prior to commencing synthesis, place, and route processes.

Once the user has manually selected a particular PLD or FPGA, a software tool can assist the user in selecting the appropriate sized device. However, previously known software tools have not assisted a user in making the determination of which PLD or FPGA to select in the first place. The user must have a detailed understanding of the architecture of all of the available PLDs and FPGAs in order to make an informed decision as to which device would best implement the user's circuit design.

Therefore, it would be desirable to provide techniques for automatically recommending a suitable programmable IC for a circuit design.

BRIEF SUMMARY OF THE INVENTION

The present invention provides techniques for automatically recommending a suitable programmable IC for a circuit design in response to receiving information about the circuit design. The information about the circuit design can be provided in any desired format. For example, specifications defining the circuit design can be provided in a spreadsheet. As another example, a user can select components for the circuit design from a software design library of existing components. As yet another example, the present invention can synthesize existing design blocks defined in HDL code and select the correct device based upon the results of synthesis.

The information about the circuit design is compared with detailed information about the features of the available programmable ICs. After analyzing the information about the circuit design, a determination is made as to which of the available programmable ICs is suitable to implement the circuit design.

Other objects, features, and advantages of the present invention will become apparent upon consideration of the following detailed description and the accompanying drawings, in which like reference designations represent like features throughout the figures.

BRIEF DESCRIPTION OF THE DRAWINGS

FIG. 2 shows a spreadsheet of specifications for a circuit design.

DETAILED DESCRIPTION OF THE INVENTION

Figure 1:
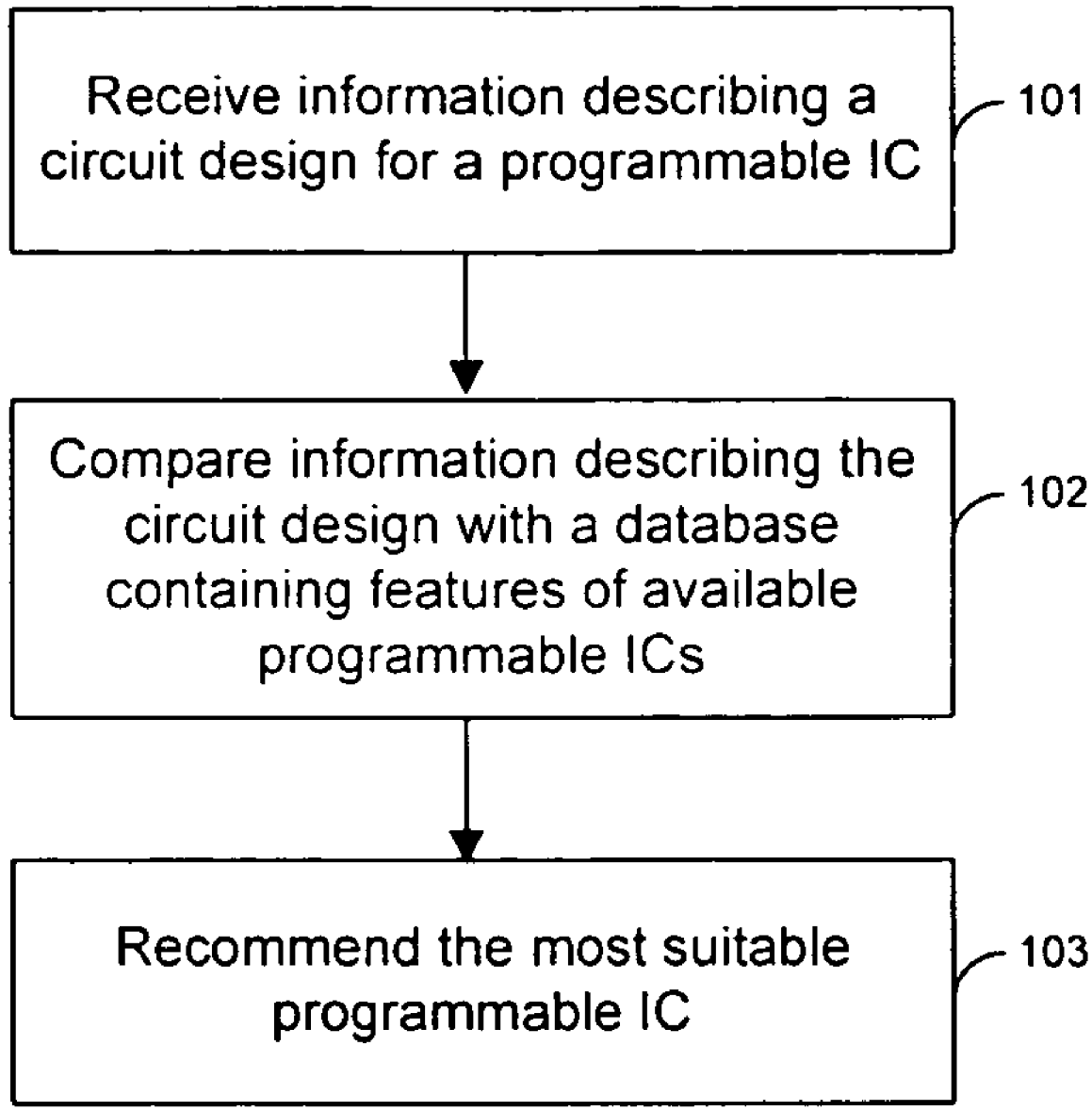
FIG. 1 is a flow chart that illustrates a methodology for automatically selecting a suitable programmable IC for a circuit design, according to the present invention.

FIG. 1 is a flow chart that illustrates a methodology for automatically recommending a suitable programmable IC for a circuit design, according to the present invention. At step 101, information describing a circuit design for a programmable IC is received. The information can be provided in any desired format.

For example, specifications defining the circuit design can be provided in a spreadsheet. FIG. 2 illustrates an example of circuit design specifications that are provided in a spreadsheet format. The spreadsheet of FIG. 2 has a number of predefined headings for the rows and columns. The user can enter specifications for the circuit design under these headings.

Examples of the specification that are provided in the spreadsheet of FIG. 2 include input/output (I/O) standards, number of inputs, number of outputs, number of bidirectional drivers, package type, timing requirements, number of phase locked loops (PLLs), PLL requirements, number of transceivers, number of clocks, memory interface requirements, logic requirements, internal memory, and digital signal processing (DSP) functions.

As another example, a user can select circuit components for the circuit design from a design library of existing circuit components that have been predefined in software. Examples of predefined software circuit components include primitives, intellectual property (IP) components, and Megafunctions that have been previously parameterized using, for example, the MegaWizard feature of Quartus™ II provided by Altera Corporation of San Jose, Calif.

As yet another example, a utility of the present invention can work with existing design blocks defined in HDL code, such as Register Transfer Level (RTL) code. The utility synthesizes the HDL code to generate a synthesized version of a circuit design for each available programmable IC. A suitable programmable logic device can be selected based upon the results of synthesis.

A database contains a library of information about the available programmable logic ICs. The information in the database includes the features that each IC (device) provides. For example, the database can include information about the number of PLLs, the number of transceivers, the number of DSP blocks, the number of input and output pads, the number of bidirectional drivers, the amount of memory, and the amount of programmable logic in each device/IC. The database indicates whether the memory in a device is non-volatile memory such as EEPROMs or volatile memory such as SRAMs.

The present invention compares information describing the circuit design with the information in the database at step 102. Based on these comparisons, the present invention determines which of the devices is best able to implement the circuit design.

According to one embodiment, the present invention determines which device(s) have the circuitry required by the circuit design. The hardware in each available device is compared to the hardware requirements of the circuit design. Hardware requirements of a circuit design can be gathered by analyzing predefined software circuit components that the user has selected to characterize the circuit design. Hardware requirements of a circuit design can be also be laid out in a spreadsheet as shown in FIG. 2. Alternatively, information about the circuit design can be obtained from a synthesis of the circuit design.

For example, a design specification may require 9 PLLs and 4 transceivers. The present invention can automatically eliminate all devices that do not at least 9 hardwired PLLs and 4 hardwired transceivers. The present invention can also determine which devices have enough input ports and output ports, and which devices can implement I/O standards required by the circuit design. The present invention can also determine which devices have enough programmable logic and enough memory to implement functions in the design.

According to another embodiment, the present invention can determine which device(s) is capable of or best able to meet the timing requirements or other performance criteria of the circuit design. For example, the present invention can determine which of the available devices can support the number of clock signals required by a circuit design.

According to another embodiment, the present invention determines which of the available programmable ICs can satisfy the requirements of a circuit design at the lowest cost. For example, PLDs that can satisfy the requirements of a circuit design, but that provide more memory and programmable logic blocks that the circuit design needs are eliminated. Lower cost PLDs that have sufficient resources are recommended over higher cost PLDs.

After information about the circuit design has been compared to the database for available devices, one or more of the programmable ICs that is able to implement the circuit design is selected. Preferably, a system of the present invention identifies the programmable IC that is best able to satisfy the hardware and timing requirements of the circuit design at the lowest cost. The present invention recommends the most suitable device for the circuit design, at step 103. The present invention can also recommend more than one programmable IC that can implement the circuit design. For example, the present invention can recommend two or more devices that are roughly equivalent in terms of their ability to implement a circuit design for the greatest value to the user.

A user is then given an opportunity to select the recommended device, one of the recommended devices, or some other device. After the user selects a device, an EDA or CAD tool synthesizes, places, and routes the circuit design to the selected the device.

Figure 3:
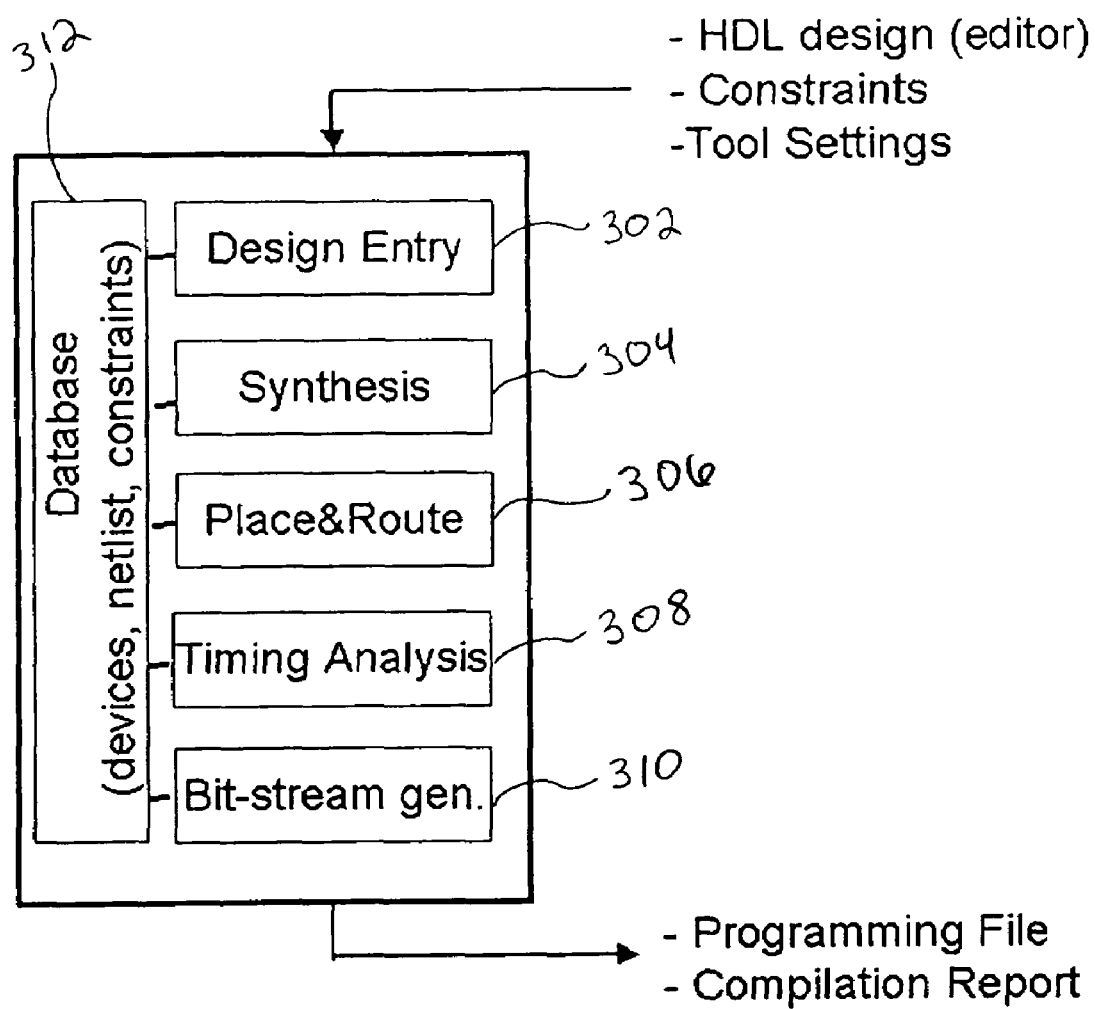
FIG. 3 shows an overall diagram of a computer-aided design (CAD) or electronic design automation (EDA) flow including synthesis.

FIG. 3 shows an example of a flow diagram of a electronic design automation (EDA) or computer-aided design (CAD) tool used in the design of integrated circuits including microprocessors, ASICS, memories, FPGAs, PLDs, and others. In a specific implementation, this flow is used to configure a programmable logic integrated circuit. As discussed above, a user typically programs a programmable logic IC with the user's desired circuit design.

FIG. 3 is an example of one technique of designing and implementing logic for a programmable logic integrated circuit. At Altera, a particular implementation of the technique of this flow is implemented using a software system referred to as Quartus™ II. This is just an example. One could draw the flow with more or fewer steps and targeting a specific or more general device hardware.

In first step of the flow, a circuit design entered at design entry step 302. The other steps of the flow include synthesis 304, place and route 306, timing analysis 308, and bit stream generation 310. Each of these steps in the process may access, store, or retrieve data from a database 312. The database may include devices, a netlist, and constraints. The database also includes the programmable logic device selected by the user. The most common implementation of this flow is as a computer program executing as part of a system similar to that shown in FIGS. 4A-4B, though other implementations are possible.

Figure 4A:
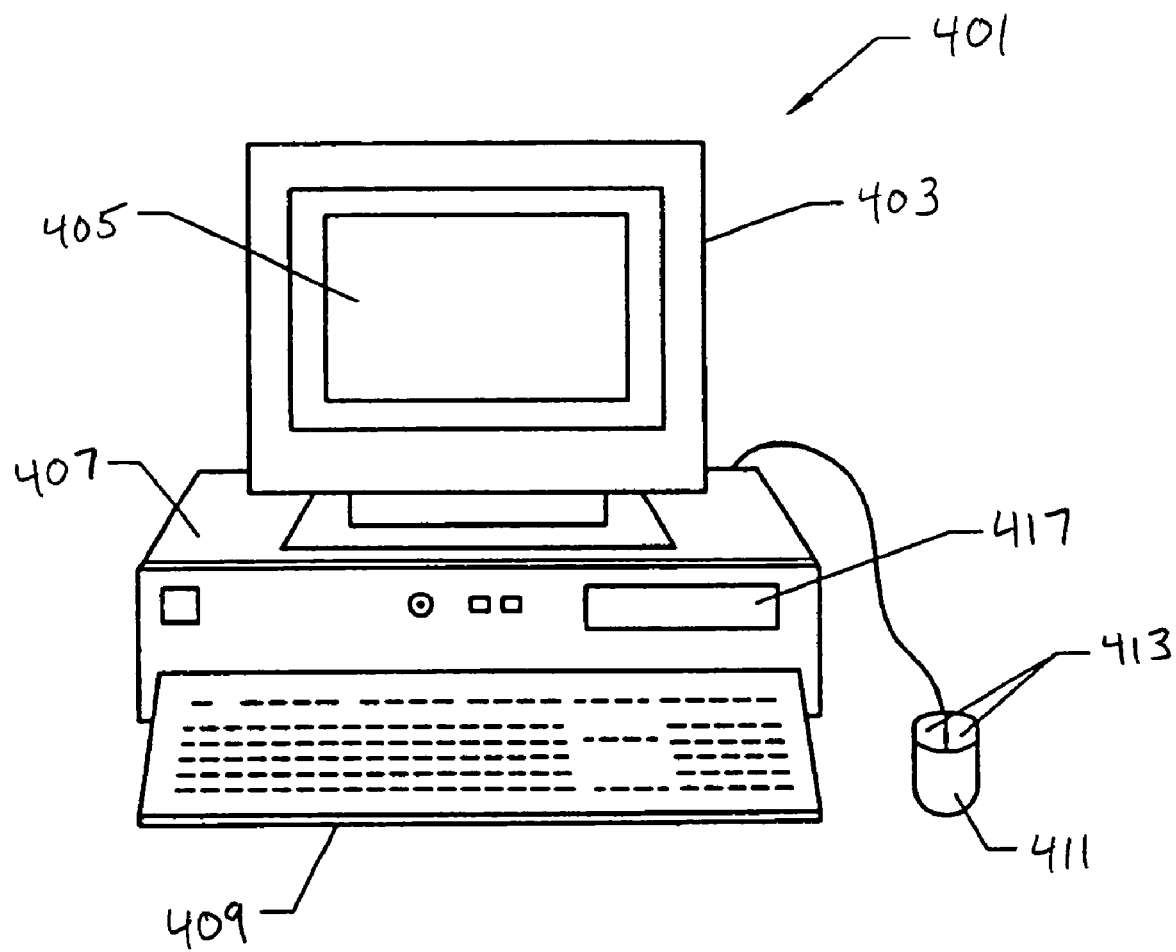
FIG. 4A shows an embodiment of a system of the present invention.

FIG. 4A shows a system of the present invention for performing physical resynthesis. In an embodiment, software of the invention executes on a computer workstation system, such as shown in FIG. 4A. FIG. 4A shows a computer system 401 that includes a monitor 403, screen 405, cabinet 407, keyboard 409, and mouse 411. Mouse 411 may have one or more buttons such as mouse buttons 413. Cabinet 407 houses familiar computer components, some of which are not shown, such as a processor, memory, mass storage devices 417, and the like.

Mass storage devices 417 may include mass disk drives, floppy disks, Iomega ZIP™ disks, magnetic disks, fixed disks, hard disks, CD-ROMs, recordable CDs, DVDs, DVD-R, DVD-RW, Flash and other nonvolatile solid-state storage, tape storage, reader, and other similar media, and combinations of these. A binary, machine-executable version, of the software of the present invention may be stored or reside on mass storage devices 417. Furthermore, the source code of the software of the present invention may also be stored or reside on mass storage devices 417 (e.g., magnetic disk, tape, or CD-ROM).

Figure 4B:
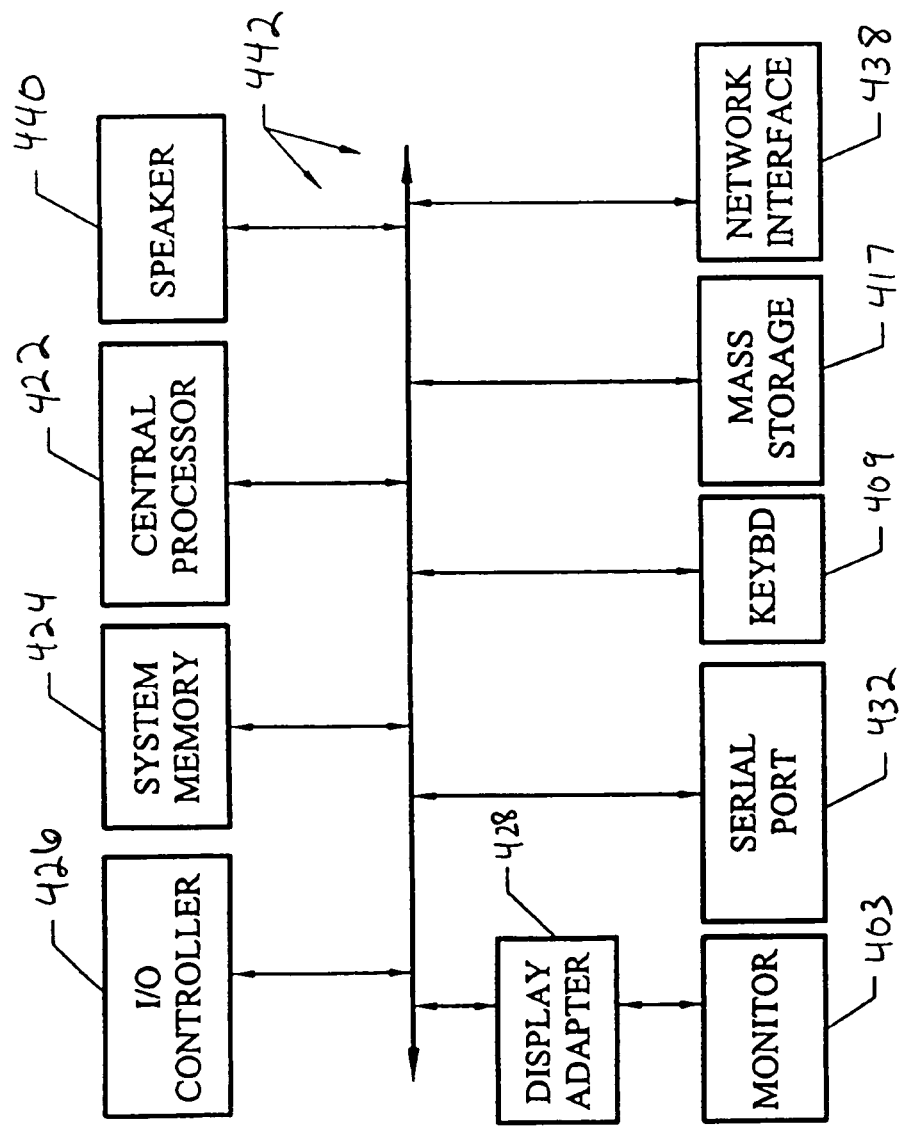
FIG. 4B shows a more detailed block diagram of the system of FIG. 4A.

Furthermore, FIG. 4B shows a system block diagram of computer system 401 used to execute the software of the present invention. As in FIG. 4A, computer system 401 includes monitor 403, keyboard 409, and mass storage devices 417. Computer system 401 further includes subsystems such as central processor 422, system memory 424, input/output (I/O) controller 426, display adapter 428, serial or universal serial bus (USB) port 432, network interface 438, and speaker 440. The invention may also be used with computer systems with additional or fewer subsystems. For example, a computer system could include more than one processor 422 (i.e., a multiprocessor system) or a system may include a cache memory.

Arrows such as 442 represent the system bus architecture of computer system 401. However, these arrows are illustrative of any interconnection scheme serving to link the subsystems. For example, speaker 440 could be connected to the other subsystems through a port or have an internal direct connection to central processor 422. Computer system 401 shown in FIG. 4A is an example of a computer system suitable for use with the present invention. Other configurations of subsystems suitable for use with the present invention will be readily apparent to one of ordinary skill in the art.

Computer software products may be written in any of various suitable programming languages, such as C, C++, Pascal, Fortran, Perl, MatLab (from MathWorks), SAS, SPSS, and Java. The computer software product may be an independent application with data input and data display modules. Alternatively, the computer software products may be classes that may be instantiated as distributed objects. The computer software products may also be component software such as Java Beans (from Sun Microsystems) or Enterprise Java Beans (EJB from Sun Microsystems). An operating system for the system may be one of the Microsoft Windows® family of operating systems (e.g., Windows 95, 98, Me, Windows NT, Windows 2000, Windows XP), Linux, UNIX, or Sun OS. Other operating systems may be used.

Furthermore, the computer may be connected to a network and may interface to other computers using this network. For example, pattern recognition may be performed via distributed computer through this network, where each computer in the network performs part of the task of the many series of pattern recognition steps in parallel. Furthermore, the network may be an intranet, internet, or the Internet, among others. The network may be a wired network (e.g., using copper), telephone network, packet network, an optical network, or a wireless network. For example, data and other information may be passed between the computer and components (or steps) of a system of the invention using a wireless network using a protocol such as Wi-Fi (IEEE standard 802.11, 802.11a, 802.11b, 802.11g, and 802.11i to name a few examples). For example, signals from a computer may be transferred, at least in part, wirelessly to a programmable logic integrated circuit.

Figure 5:
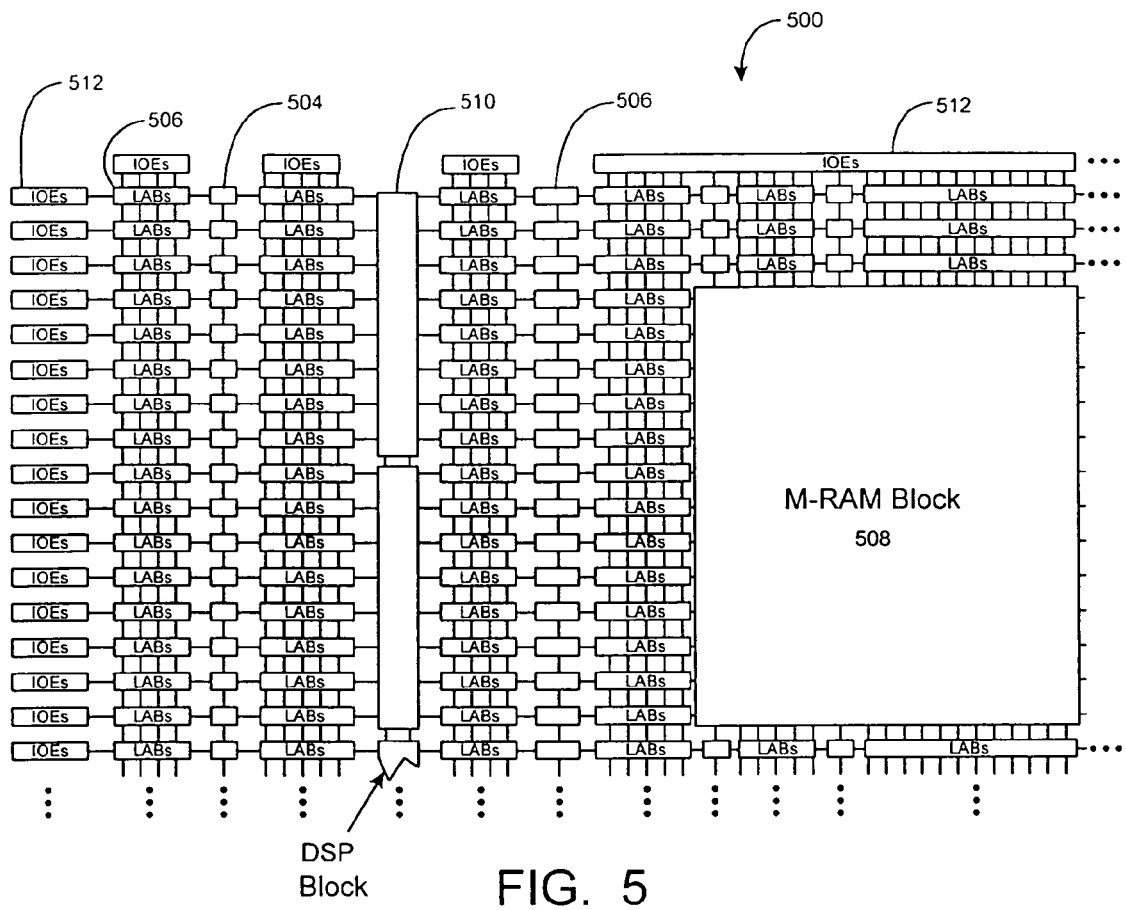
FIG. 5 is a simplified block diagram of a programmable logic device that can be used with the techniques of the present invention.

FIG. 5 is a simplified partial block diagram of an example of a PLD 500. It should be understood that the present invention can be used to select from among numerous types of programmable integrated circuits. PLD 500 is an example of a programmable logic integrated circuit for which techniques of the present invention can be implemented. PLD 500 includes a two-dimensional array of programmable logic array blocks (or LABs) 502 that are interconnected by a network of column and row interconnects of varying length and speed. LABs 502 include multiple (e.g., 10) logic elements (or LEs).

An LE is a programmable logic block that provides for efficient implementation of user defined logic functions. PLD 500 has numerous logic elements that can be configured to implement various combinatorial and sequential functions. The logic elements have access to a programmable interconnect structure. The programmable interconnect structure can be programmed to interconnect the logic elements in almost any desired configuration.

PLD 500 also includes a distributed memory structure including RAM blocks of varying sizes provided throughout the array. The RAM blocks include, for example, 512 bit blocks 504, 4K blocks 506 and a block 508 that provides 512K bits of RAM. These memory blocks can also include shift registers and FIFO buffers.

PLD 500 further includes digital signal processing (DSP) blocks 510 that can implement, for example, multipliers with add or subtract features. I/O elements (IOEs) 512 located, in this example, around the periphery of the device support numerous single-ended and differential I/O standards. It is to be understood that PLD 500 is described herein for illustrative purposes only and that the present invention can be evaluate many different types of PLDs, FPGAs, and the like.

Figure 6:
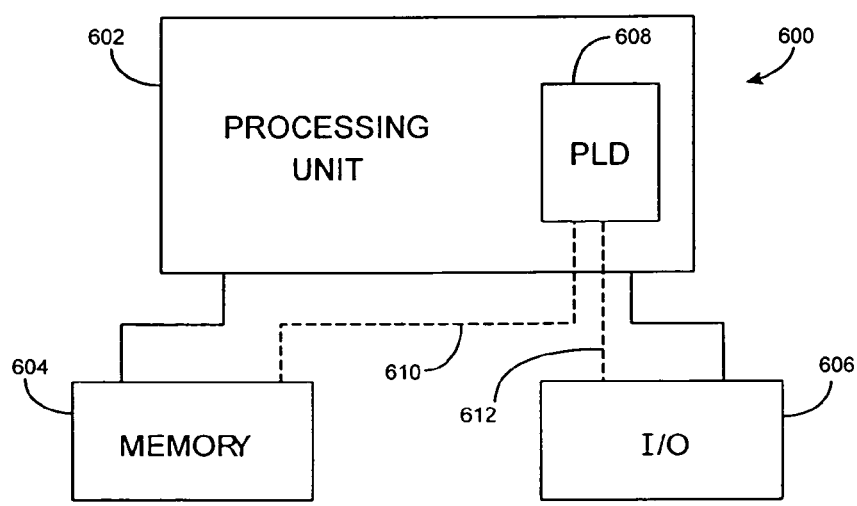
FIG. 6 is a block diagram of an electronic system that can implement embodiments of the present invention.

While PLDs of the type shown in FIG. 5 provide many of the resources required to implement system level solutions, the present invention can also benefit systems wherein a PLD is one of several components. FIG. 6 shows a block diagram of an exemplary digital system 600, for which the present invention can be implemented. System 600 can be a programmed digital computer system, digital signal processing system, specialized digital switching network, or other processing system. Moreover, such systems can be designed for a wide variety of applications such as telecommunications systems, automotive systems, control systems, consumer electronics, personal computers, Internet communications and networking, and others. Further, system 600 can be provided on a single board, on multiple boards, or within multiple enclosures.

System 600 includes a processing unit 602, a memory unit 604 and an I/O unit 606 interconnected together by one or more buses. According to this exemplary embodiment, a programmable logic device (PLD) 608 is embedded in processing unit 602. PLD 608 can serve many different purposes within the system in FIG. 6. PLD 608 can, for example, be a logical building block of processing unit 602, supporting its internal and external operations. PLD 608 is programmed to implement the logical functions necessary to carry on its particular role in system operation. PLD 608 can be specially coupled to memory 604 through connection 610 and to I/O unit 606 through connection 612.

Processing unit 602 can direct data to an appropriate system component for processing or storage, execute a program stored in memory 604 or receive and transmit data via I/O unit 606, or other similar function. Processing unit 602 can be a central processing unit (CPU), microprocessor, floating point coprocessor, graphics coprocessor, hardware controller, microcontroller, programmable logic device programmed for use as a controller, network controller, and the like. Furthermore, in many embodiments, there is often no need for a CPU.

For example, instead of a CPU, one or more PLDs 608 can control the logical operations of the system. In an embodiment, PLD 608 acts as a reconfigurable processor, which can be reprogrammed as needed to handle a particular computing task. Alternately, programmable logic device 608 can itself include an embedded microprocessor. Memory unit 604 can be a random access memory (RAM), read only memory (ROM), fixed or flexible disk media, PC Card flash disk memory, tape, or any other storage means, or any combination of these storage means.

While the present invention has been described herein with reference to particular embodiments thereof, a latitude of modification, various changes, and substitutions are intended in the present invention. In some instances, features of the invention can be employed without a corresponding use of other features, without departing from the scope of the invention as set forth. Therefore, many modifications may be made to adapt a particular configuration or method disclosed, without departing from the essential scope and spirit of the present invention. It is intended that the invention not be limited to the particular embodiments disclosed, but that the invention will include all embodiments and equivalents falling within the scope of the claims.

What is claimed is:

1. A computer system for automatically recommending a programmable integrated circuit (IC), the computer system comprising:
   code for receiving information describing a circuit design for a programmable IC, wherein the code for receiving information describing a circuit design includes:
   code for receiving HDL code defining the circuit design;
   code for synthesizing the HDL code to produce a synthesized version of the circuit design;
   code for extracting information describing the circuit design from the synthesized version of the circuit design;
   code for comparing the information describing the circuit design with a database containing features of available programmable ICs, wherein if the information received by the code for receiving information about the circuit design comprises HDL code, the code for comparing the information describing the circuit compares the information extracted from the synthesized version of the circuit design with the database; and
   code for recommending a suitable programmable IC for the circuit design from among the available programmable ICs based on information gathered from the code for comparing.

2. The computer system defined in claim 1 wherein the code for comparing further comprises code for comparing hardware features of the available programmable ICs to hardware requirements of the circuit design.

3. The computer system defined in claim 1 wherein the information describing the circuit design is stored in a spreadsheet.

4. The computer system defined in claim 1 wherein the code for receiving further comprises code for accessing the information describing the circuit design from circuit components that perform functions of the circuit design, wherein the circuit components have been defined in software.

5. The computer system defined in claim 1 wherein the code for comparing further comprises code for comparing timing features of the available programmable ICs to timing requirements of the circuit design.

6. The computer system defined in claim 1 wherein the code for recommending the suitable programmable IC for the circuit design further comprises code for preferentially recommending a lower cost programmable IC that is able to implement the circuit design.

7. The computer system defined in claim 1 wherein the code for receiving the information describing the circuit design receives circuit components for the circuit design selected by a user from a design library of existing circuit components.

8. A system for automatically recommending a programmable integrated circuit (IC) for implementing a circuit design, the system comprising:
   means for receiving information describing a circuit design for a programmable IC, wherein the means for receiving information describing a circuit design includes:
   means for receiving HDL code defining the circuit design;
   means for synthesizing the HDL code to produce a synthesized version of the circuit design;
   means for extracting information describing the circuit design from the synthesized version of the circuit design;
   means for comparing the information describing the circuit design with a database containing features of available programmable ICs, wherein if the information received by the means for receiving information about the circuit design comprises HDL code, the means for comparing the information describing the circuit compares the information extracted from the synthesized version of the circuit design with the database; and
   means for recommending a suitable programmable IC for the circuit design from among the available programmable ICs based on information generated by the means for comparing.

9. The system defined in claim 8 wherein the means for comparing further comprises means for comparing hardware features of the available programmable ICs to hardware requirements of the circuit design.

10. The system defined in claim 8 wherein the information describing the circuit design is stored in a spreadsheet.

11. The system defined in claim 8 wherein the means for comparing further comprises means for comparing timing features of the available programmable ICs to timing requirements of the circuit design.

12. The system defined in claim 8 wherein the means for recommending the suitable programmable IC for the circuit design further comprises means for preferentially recommending a lower cost programmable IC that is able to implement the circuit design.

13. The system defined in claim 8 wherein the means for receiving the information describing the circuit design receives circuit components for the circuit design selected by a user from a design library of existing circuit components.

14. A method for automatically recommending a programmable integrated circuit (IC) for implementing a circuit design, the system comprising:
   receiving information about a circuit design for a programmable IC, wherein if the information about the circuit design comprises HDL code defining the circuit design, receiving the information about the circuit design includes:
   synthesizing the HDL code to produce a synthesized version of the circuit design; and
   extracting information describing the circuit design from the synthesized version of the circuit design;
   comparing the information about the circuit design with a database containing features of available programmable ICs, wherein if the information received by in the step of receiving information about the circuit design comprises HDL code, the comparing the information describing the circuit comprises:
   comparing the information extracted from the synthesized version of the circuit design with the database; and
   recommending a suitable programmable IC for the circuit design from among the available programmable ICs based on information generated by comparing the information about the circuit design to the programmable IC.

15. The method defined in claim 14 wherein comparing the information about the circuit design further comprises comparing timing features of the available programmable ICs to timing requirements of the circuit design.

16. The method defined in claim 14 wherein receiving the information about the circuit design further comprises receiving circuit components for the circuit design selected by a user from a design library of existing circuit components.

17. The method defined in claim 14 wherein recommending the suitable programmable IC for the circuit design further comprises preferentially recommending a lower cost programmable IC that is able to implement the circuit design.

* * * * *